US007123069B2

(12) United States Patent  
Minzoni

(10) Patent No.: US 7,123,069 B2
(45) Date of Patent: Oct. 17, 2006

(54) LATCH OR PHASE DETECTOR DEVICE

(75) Inventor: Alessandro Minzoni, Morrisville, NC (US)

(73) Assignee: Infineon Technologies, AG, Munich (DE)

( * ) Notice: Subject to any disclaimer, the term of this patent is extended or adjusted under 35 U.S.C. 154(b) by 39 days.

(21) Appl. No.: 10/834,378

(22) Filed: Apr. 29, 2004

(65) Prior Publication Data

US 2004/0263229 A1    Dec. 30, 2004

(30) Foreign Application Priority Data

Apr. 30, 2003   (DE)   ................ 103 20 793

(51) Int. Cl.
*H03K 3/12*   (2006.01)
(52) U.S. Cl. .......................... 327/216; 327/3
(58) Field of Classification Search ............. 327/3, 327/5, 199, 217–219, 225
See application file for complete search history.

(56) References Cited

U.S. PATENT DOCUMENTS

| | | | | |
|---|---|---|---|---|
| 3,467,839 A * | 9/1969 | Miller | .......... | 327/216 |
| 3,523,252 A * | 8/1970 | Chikli-Pariente | ........... | 377/78 |
| 3,588,546 A * | 6/1971 | Lagemann | ............ | 327/215 |
| 3,755,746 A * | 8/1973 | Hogue et al. | ......... | 327/43 |
| 3,866,133 A * | 2/1975 | Debloois et al. | ........ | 327/7 |
| 4,451,794 A * | 5/1984 | Yamada | ............ | 327/8 |
| 4,568,843 A * | 2/1986 | Gloanec et al. | ........ | 327/217 |
| 4,868,511 A * | 9/1989 | Des Brisay, Jr. | ........ | 327/141 |
| 4,928,026 A * | 5/1990 | Ebesyu | ............. | 327/12 |
| 4,980,577 A * | 12/1990 | Baxter | ............. | 327/198 |
| 5,095,287 A * | 3/1992 | Irwin et al. | ........ | 331/1 A |
| 5,200,649 A * | 4/1993 | Fukui | ............. | 327/218 |
| 5,625,309 A * | 4/1997 | Fucili et al. | ........ | 327/217 |
| 5,744,983 A * | 4/1998 | Bazes | ............. | 327/3 |
| 5,942,926 A * | 8/1999 | Yamaguchi | ........ | 327/156 |
| 6,058,152 A * | 5/2000 | Tanishima | ........ | 375/376 |
| 6,121,846 A * | 9/2000 | Ahola et al. | ........ | 331/27 |
| 6,208,188 B1 * | 3/2001 | Shionoya | ........ | 327/218 |
| 6,323,710 B1 * | 11/2001 | Piguet et al. | ........ | 327/218 |
| 6,351,154 B1 * | 2/2002 | Brachmann et al. | ........ | 327/12 |
| 6,424,180 B1 * | 7/2002 | Killorn | ........ | 327/12 |
| 6,590,427 B1 * | 7/2003 | Murray et al. | ........ | 327/12 |
| 6,661,262 B1 * | 12/2003 | Curran | ........ | 327/116 |
| 6,714,060 B1 * | 3/2004 | Araki | ........ | 327/202 |

FOREIGN PATENT DOCUMENTS

DE      27 11 909      9/1977
DE      691 24 981    12/1991

* cited by examiner

*Primary Examiner*—Linh My Nguyen
*Assistant Examiner*—Thomas J. Hiltunen
(74) *Attorney, Agent, or Firm*—Morrison & Foerster LLP

(57)     ABSTRACT

The invention relates to a circuit device, into which a first signal and a second signal are input, wherein a first switching array is provided, by means of which it is determined which of the two signals, is the first to change its state. The circuit device may also have a second switching array, which emits an output signal, which when the first signal first has changed its state, changes its state in reaction to a change in the state of the first signal, and, when the second signal first has changed its state, changes its state in reaction to a change in the state of the first signal.

32 Claims, 2 Drawing Sheets

LATCH OR PHASE DETECTOR DEVICE

CLAIM FOR PRIORITY

This application claims the benefit of priority to German Application No. 103 20 793.7, filed in the German language on Apr. 30, 2003, the contents of which are hereby incorporated by reference.

TECHNICAL FIELD OF THE INVENTION

The invention relates to a circuit device, in particular a latch or phase detector device according.

BACKGROUND OF THE INVENTION

Conventional latch devices are for instance used in semi-conductor components (such as memory components, for instance DRAMs (DRAM=Dynamic Random Access Memory and/or Dynamic Read/Write Memory)) for the storage and/or interim storage of data, which can then be output again, for instance synchronously with a clock pulse (clk signal) used on the semi-conductor component.

State-of-the-art latch devices may for instance consist of two transfer gates and four inverters.

The input of the first transfer gate is connected to a data-input line, by means of which the data to be latched (by means of a corresponding data-input signal (data signal)) is input into the latch device. A first control connection of the first transfer gate is connected to a (first) clock line on which the clock pulse (clk signal) is present, and a further—inverse—control connection of the first transfer gate to a (further) clock line, on which a clock pulse (bclk signal), inverse to the clock pulse (clk signal) is present.

The output of the first transfer gate is connected to the input of the first inverter. The output of the first inverter is connected to the input of the second transfer gate, and to the input of the second inverter, of which the output is back connected to the input of the first inverter.

The (first) control connection of the second transfer gate is—correspondingly inverse as with the first transfer gate—connected to the above further inverse clock line (on which—as described above—the inverse clock pulse (bclk signal) is present), and the (further)—inverse—control connection of the second transfer gate is—again correspondingly inverse to the first transfer gate—connected to the first clock line (where —as described above—the clock pulse (clk signal) is present).

The output of the second transfer gate is connected to the input of the third inverter. The output of the third inverter is connected to the input of the fourth inverter, of which the output is back connected to the input of the third inverter, as well as to a data output line, by means of which the data—in latched form—that has been input into the latch device (and/or the above data-input line) can be output again synchronously with the clock pulse (clk signal)(by means of a corresponding data output signal (ldata signal)).

The data to be input into the latch device (data signal) must have been present in a stable state on the data input line for a predetermined time ahead of a corresponding (e.g. positive) flank of the clock pulse (clk signal) (and/or of a corresponding (e.g. negative) flank of the inverse clock pulse (bclk signal)), (the so-called "setup" time ($T_{setup}$) to ensure fault-free latching of the data.

In addition, to ensure fault-free latching of the data, it must also have been present in a stable state up to a pre-determined time after the corresponding (positive) flank of the clock pulse (clk signal) (and/or of the corresponding (negative) flank of the inverse clock pulse (bclk signal)) (the so-called "hold" time ($T_{hold}$)).

The "set-up" and "hold" times may—in total—be of a duration of ca. 50 to 200 picoseconds, which may be problematic, particularly at high frequencies and/or for the "critical path" that determines the efficiency of all the semi-conductor components.

The above "set-up" and "hold" times could be reduced if it could be ascertained that the clock—and the inverse clock pulses (clk and bclk signals)—were completely complementary to one another (and that they would not change their states at times minimally varying from each other, from "high logic" to "low logic" (negative flank) and correspondingly inverted from "low logic" to "high logic" (positive flank).

This goal is however not at all, or only partly (and unsatisfactorily) attainable with conventional latch devices, e.g. due to inaccuracies occurring in corresponding semi-conductor components during the manufacturing process.

SUMMARY OF THE INVENTION

The invention relates to a circuit device, in particular a latch and phase detector device, in particular a latch device with which the "set-up" and/or "hold" time may be reduced in comparison with conventional latch devices.

According to one embodiment of the invention, a circuit device is provided into which a first signal (data) and a second signal (clk) are input, wherein a first switching array is provided, with which it is determined which of the two signals (data, clk) is the first to change its state. Advantageously, furthermore, a second switching array provided, which emits an output signal (out, bout), which when the first signal (data) first changes its state, changes its state in reaction to a change in the state of the second signal (clk), and when the second signal (clk) first changes its state, changes its state in reaction to a change in the state of the first signal (data).

BRIEF DESCRIPTION OF THE DRAWINGS

The invention is more closely described below with by use of exemplary embodiments and the accompanying drawings. In the drawings.

DETAILED DESCRIPTION OF THE INVENTION

Figure 1:
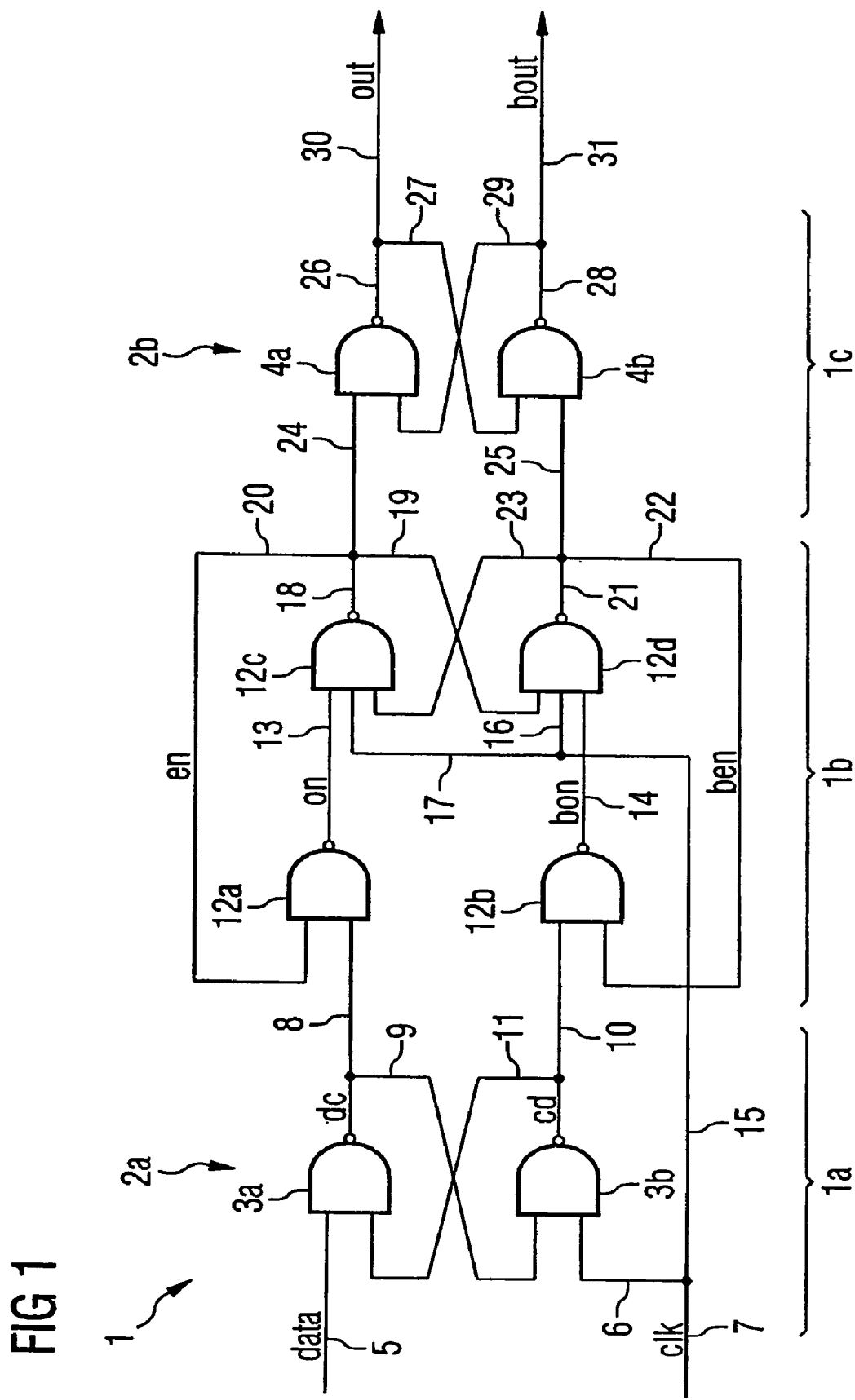
FIG. 1 shows a schematic representation of a circuit device according to an embodiment example of the present invention.

FIG. 1 shows a schematic representation of a device 1 according to an embodiment example of the present invention.

The circuit device 1 is incorporated into a semi-conductor component—e.g. based on CMOS technology—for instance a logic and/or memory component, such as a DRAM (DRAM=Dynamic Random Access Memory and/or dynamic read/write memory), in particular a DRAM memory component with double data rate (DDR-DRAM).

The circuit device 1 may then for instance also be used—correspondingly similar to conventional latch devices—for the storage and/or interim storage of data in chronological relation to a clock pulse (clk signal) used in the semi-conductor component, and then to re-emit it.

As FIG. 1 shows, the circuit device 1 has essentially three circuit sections, 1*a*, 1*b*, 1*c*.

The first and third circuit sections 1*a*, 1*c* are each formed by a—correspondingly connected—RS flip-flop 2*a*, 2*b*.

As FIG. 1 shows, in the present embodiment example the first RS flip-flop 2*a* has two NAND gates 3*a*, 3*b* (here: two 2-NAND gates 3*a*, 3*b*), and the second RS flip-flop 2*b* two NAND gates 4*a*, 4*b* (here: two 2-NAND gates 4*a*, 4*b*). In alternative embodiment examples not shown here, correspondingly inverse NOR gate-based RS flip-flop may e.g. also be used in the place of NAND gate-based RS flip-flop 2*a*, 2*b* (where required with the alternative use of a clock pulse (bclk signal), inverse in relation to the above clock pulse (clk signal)).

As seen in FIG. 1, the embodiment example shown here has a first input of the first NAND gate 3*a* of the first RS flip-flop 2*a* connected to a data input line 5, with which the data to be latched is input into the circuit device 1 (by means of a corresponding data-input signal (data signal)).

A first input of the second NAND gate 3*b* of the first RS flip-flop 2*a* is connected—by means of a line 6—to a clock line 7, through which the above clock pulse (clk signal) is input into the circuit device 1.

The output of the first NAND gate 3*a* of the first RS flip-flop 2*a* is back connected via a line 8, together with a line 9 connected to it, to a second input of the second NAND gate 3*b* of the first RS flip-flop 2*a* so that a signal (dc signal) emitted at an output of the first NAND gate 3*a* of the first RS flip-flop 2*a*, is fed to the second input of the second NAND gate 3*b* of the first RS flip-flop 2*a*).

Correspondingly reversed, the output of the second NAND gate 3*b* of the first RS flip-flop 2*a*—via a line 10, and a line 11 connected to it—is back-connected to a second input of the first NAND gate 3*a* of the first RS flip-flop 2*a* (so that a signal (cd signal) emitted at the output of the second NAND gate 3*b* of the first RS flip-flop 2*a*, is fed to the second input of the first NAND gate 3*a* of the first RS flip-flop 2*a*).

As further shown in FIG. 1, the circuit device 1—at the above second circuit section 1*b*—has four further NAND gates 12*a*, 12*b*, 12*b*, 12*c* (or alternatively e.g.—correspondingly inverse—corresponding NOR gates), namely two 2-NAND gates 12*a*, 12*b*, and two 3-NAND gates 12*c*, 12*d*.

The signal (dc signal) emitted at the output of the first NAND gate 3*a* of the first RS flip-flop 2*a* of the first circuit section 1*a* is fed—via line 8—to a first input of the first NAND gate 12*a* of the second circuit section 1*b*, and the signal (cd signal) emitted at the output of the second NAND gate 3*b* of the first RS flip-flop 2*a* of the first circuit section 1*a* is fed—via line 10—to a first input of the second NAND gate 12*b* of the second circuit section 1*b*.

As further shown in FIG. 1, a signal (on signal) emitted at the output of the first NAND gate 12*a* of the second circuit section 1*b* is fed via a line 13 to a first input of the third NAND gate 12*c* (here: of the 3-NAND gate 12*c*) of the second circuit section.

In corresponding fashion, a signal (bon signal) emitted at the output of the second NAND gate 12*b* of the second circuit section 1*b* is fed via a line 14 to a first input of the fourth NAND gate 12*d* (here: of the 3-NAND gate 12*d*) of the second circuit section 1*b*.

The clock pulse (clk signal) is further fed to second input of the third NAND gate 12*c* of the second circuit section 1*b*, and/or to a second input of the fourth NAND gate 12*d* of the second circuit section 1*b*—via a line 15, which is connected to the clock-line 7 and via the lines 16 and/or 17, connected to line 15.

The signal (en signal) emitted at the output of the third NAND gate 12*c* of the second circuit section is fed to a second input of the first NAND gate 12*a* of the second circuit section 1*b* via a line 18, and a line 20 connected to it, and fed via a line 19—connected to line 18—to a third input of the fourth NAND gate 12*d* of the second circuit section 1*b*.

Correspondingly reversed, the signal (ben signal) emitted at the output of the fourth NAND gate 12*d* of the second circuit section 1*b* is fed to a second input of the second NAND gate 12*b* of the second circuit section 1*b* via a line 21 and a line 22 connected to it, and—via a line 23 connected to line 21—to a third input of the third NAND gate 12*c* of the second circuit section 1*b*.

As further shown in FIG. 1, the signal (en signal) emitted at the output of the third NAND gate 12*c* of the second circuit section 1*b* is fed—via the line 18, and a line 24 connected to it—to a first input of the first NAND gate 4*a* of the third circuit section 1*c* (i.e. the first input of the second RS flip-flop 2*b*).

Correspondingly the signal (ben signal) emitted at the output of the fourth NAND gate 12*d* of the second circuit section 1*b* is fed—via the line 21, and a line 25 connected to it—to a first input of the second NAND gate 4*b* of the third circuit section 1*c* (i.e. the second input of the second RS flip-flop 2*b*).

The output of the first NAND gate 4*a* of the third circuit section 1*c* (and/or of the second RS flip-flop 2*b*) is back connected via a line 26, and a line 27 connected to it, to a second input of the second NAND gate 4*b* of the second RS flip-flop 2*b* (so that a (data output) signal (out signal) emitted at the output of the first NAND gate 4*a* of the second RS flip-flop 2*b* is fed to the second input of the second NAND gate 4*b* of the second RS flip-flop 2*b*).

Correspondingly reversed, the output of the second NAND gate 4*b* of the third circuit section 1*c* (and/or the second RS flip-flop 2*b*) is back connected—via a line 28, and a line 29 connected to it—to a second input of the first NAND gate 4*a* of the second RS flip-flop 2*b* (so that a (data output) signal (bout signal) emitted at the output of the second NAND gate 4*b* of the second RS flip-flop 2*b* is fed to the second input of the first NAND gate 4*a* of the second RS flip-flop 2*b*).

As further shown in FIG. 1, the data output signal (out signal) emitted at the output of the first NAND gate 4*a* of the second RS flip-flop 2*b* is fed via the above line 26, and a data output-line 30 connected to it—to a (first) output of the circuit device 1, and the (further, inverse) data output signal (bout signal) emitted at the output of the second NAND gate 4*b* of the second RS flip-flop 2*b* is fed—via the above line 28, and a (further, inverse) data output-line 31 connected to it—to a (further, inverse) output of the circuit device 1.

Below, the operation of the circuit device 1 is more closely described with reference to FIG. 1 as well as to the signal timing diagram shown in FIG. 2*a* and 2*b*, and in particular i) for the case where first the data-input signal (data signal), and then the clock pulse (clk signal) change their states (cf. FIG. 2*a*), and ii) for the case where first the clock pulse (clk signal), and then the data-input signal (data signal) change their states (cf. FIG. 2b).

Figure 2A:
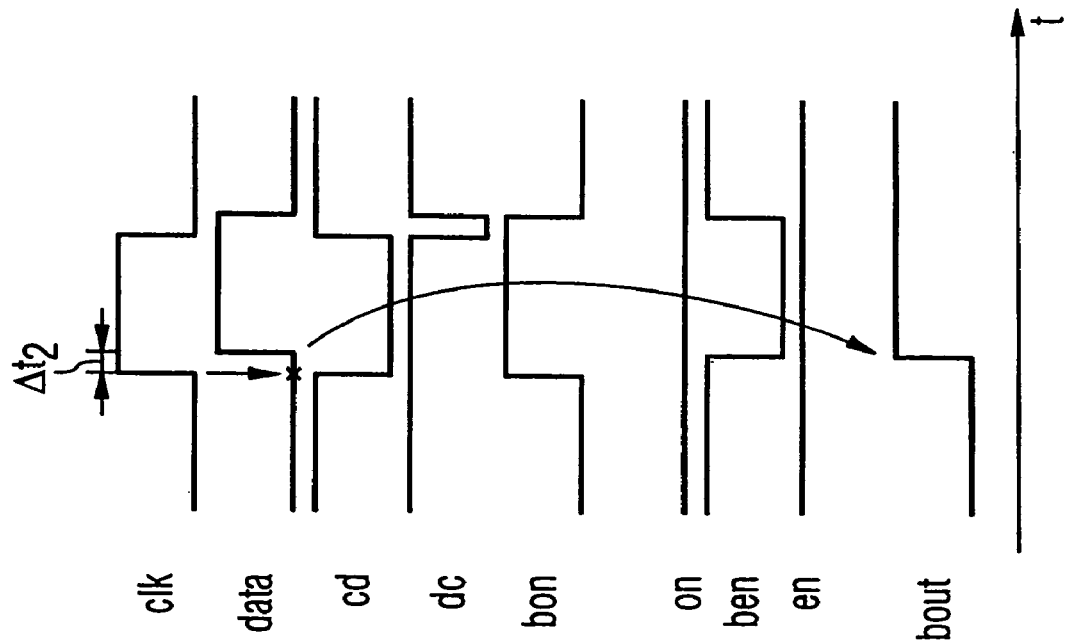
FIG. 2a shows a signal timing diagram to illustrate the chronological sequence of state changes of signals occurring in the circuit arrangement as in FIG. 1, where the data-input signal changes its state first, and is then followed by the clock pulse.

When—referring to FIG. 2a—the data-input signal (data signal) present at the data input line 5 and fed to the first input of the first NAND gate 3a of the first RS flip flop 2a, changes its state from "high logic" to "low logic" (while the clock pulse (clk signal) present at the clock-line 7 is in a "low logic" state), the signal (dc signal) emitted at the output of the first NAND gate 3a of the first RS flip flop 2a changes its state from "high logic" to "low logic" (whereas the signal (cd signal) emitted at the output of the second NAND gate 3b of the first RS flip flop 2a remains in a "high logic" state—regardless of the state of the clock pulse (clk signal)).

As a result of the change in the state of the dc signal, the signal (on signal) emitted at the output of the first NAND gate 12a of the second circuit section 1b changes its state from "low logic" to "high logic"—the bon signal remains "low logic".

Due to the initially still "low logic" state of the clock pulse (clk signal) present at the second input of the third NAND gate 12c of the second circuit section 1b, the signal 1 (en signal) emitted at the output of the third NAND gate 12c of the second circuit section 1b) at first remains "high logic".

When the data input signal (data-signal) then—e.g. a time period of $\Delta t_2$ after the clock signal (clk-signal)—changes its state from "low logic" to "high logic", the signal (ben-signal) emitted at the output of the fourth NAND gate 12d of the second circuit section 1b changes its state from "high logic" to "low logic".

This change of the signal (en signal)—fed to the first input of the first NAND gate 4a of the second RS flip flop 2b, from "high logic" to "low logic", causes the data output signal (out signal) emitted at the output of the first NAND gate 4a of the second RS flip flop 2b—and therewith the (inverse) data output signal (bout signal) present at the (inverse) first output of the circuit device 1—to change from a "low logic" to a "high logic" state. With the aid of the above (en signal, and/or ben signal) emitted at the outputs of the 3-NAND gates 12c, 12d of the second circuit section 1b, and back-connected to the first and second 2-NAND gate signals 12a, 12b of the second circuit section, the first and/or second 2-NAND gate 12a, 12b are correspondingly blocked and/or deactivated (and only later activated or unblocked again), whereby it is ensured that the data output signal (out signal) retains its "high logic" state, at least until the next negative flank of the clock pulse (clk signal).

Figure 2B:
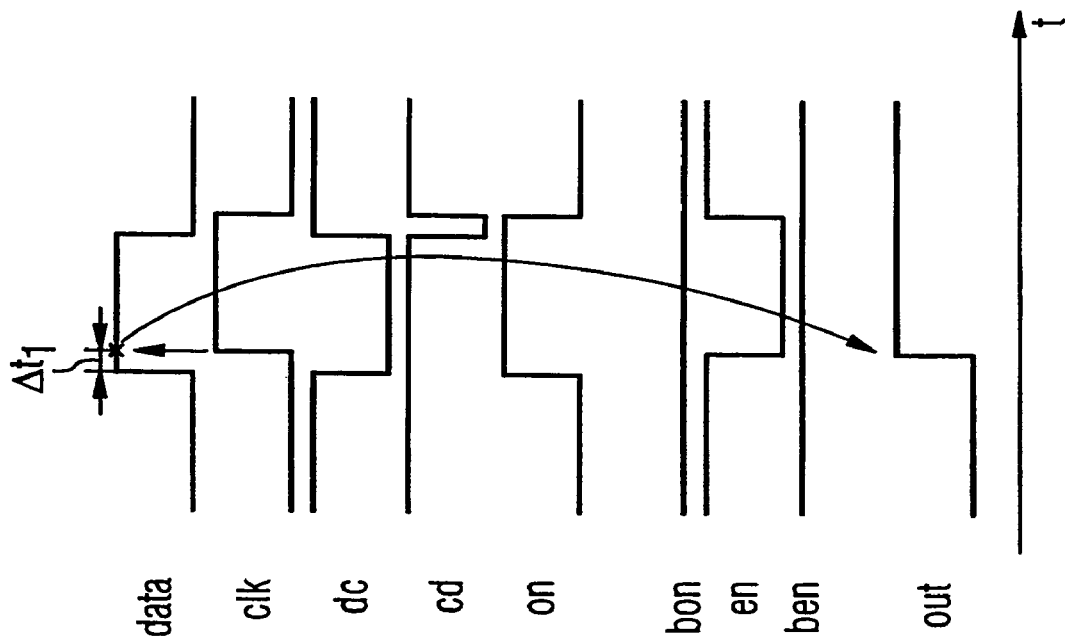
FIG. 2b shows a signal timing diagram to illustrate the chronological sequence of state changes of signals occurring in the circuit arrangement as in FIG. 1, where the clock pulse changes its state first, and is then followed by the data-input signal.

In FIG. 2b a signal timing diagram is shown to illustrate the chronological sequence of the state changes of the signals occurring in the circuit device 1 as shown in FIG. 1, for the case where first the clock pulse (clk signal), and then the data input signal (data signal) change their states.

When, according to FIG. 2b, the clock pulse (clk signal)—present as described above at the clock line 7 and fed to the first input of the second NAND gate 3b of the first RS flip flop 2a—changes its state from "low logic" to "high logic" (at the continued "low logic" state of the data-input signal (data signal) present at the data input line 5), the signal (cd signal) emitted at the output of the second NAND gate 3b of the first RS flip flop 2a changes its state from "high logic" to "low logic" (whereas the signal (dc signal) emitted at the output of the first NAND gate 3a of the first RS flip flop 2a—irrespective of the state of the clock pulse (clk signal)—remains in a "high logic" state).

As a result of the state change of the cd signal, the signal (bon signal) emitted at the output of the second NAND gate 12b of the second circuit section 1b, changes its state from "low logic" to "high logic"; the on signal remains "low logic".

Due to the at first still "low logic" state of the data-input signal (data signal) present at the data input line 5, the signal (ben signal) emitted at the output of the fourth NAND gate 12d of the second circuit section 1b at first remains in a "high logic" state.

When the data-input signal (data signal) then changes its state from "low logic" to "high logic", then—e.g. after a time period of $\Delta t_2$ after the clock pulse (clk signal)—the signal (ben signal) emitted at the output of the fourth NAND gate 12d of the second circuit section 1b, changes its state from "high logic" to "low logic".

The changes in this signal (ben signal)—fed to the first input of the second NAND gate 4b of the second RS flip flop 2b—from "high logic" to "low logic"—cause the (inverse) data output signal (bout signal) emitted at the output of the second NAND gate 4b of the second RS flip flop 2b—and thereby at the (inverse) output of the circuit device 1—to change over from a "low logic" to a "high logic" state.

With the aid of the signals (en signal, and/or ben signal) emitted at the above outputs of the 3-NAND gate 12c, 12d of the second circuit section 1b, and back-connected to the first and second 2-NAND gate 12a, 12b, the first and/or second 2-NAND gate 12a, 12b of the second circuit section 1b is correspondingly blocked and/or deactivated (and later reactivated or unblocked again), whereby it is ensured that the data output signal (bout signal) maintains its "high logic" state at least until the next, negative flank of the clock pulse (clk signal).

In the circuit device 1 shown in FIG. 1, the first circuit section 1a (here: the RS flip-flop 2a) essentially serves to determine, which of the two input signals fed to the circuit device 1—the first data-input signal (data signal) fed to the NAND gate 3a, or the clock pulse (clk signal) fed to the second NAND gate 3b—is the first to change its state ("evaluation").

This takes place in that—as described above—the output of that NAND gate 3a, 3b, to which that input signal (data-input signal (data signal), or clock pulse (clk signal)), which first changes its state (here: from "low logic" to "high logic") is fed, changes to a "low logic" state (dc signal and/or cd signal), whereby the complementary output (cd signal and/or dc signal) is prevented from also changing to a "low logic" state.

As only the two outputs of the first circuit section 1a (i.e. the output of the first NAND gate 3a, or the output of the second NAND gate 3b) can find themselves in a "low logic" state, neither the output of the first NAND gate 12a of the second circuit section 1b (i.e. the on signal), nor the output of the second NAND gate 12b of the second circuit section 1b (i.e. the bon signal) can be in a "high logic" state in each case, while the clock pulse (clk signal) is "low logic".

After the state of the clock pulse (clk signal) has changed from "low logic" to "high logic", the second circuit section 1b (and/or more correctly of that of the 3-NAND gates 12c, 12d) accordingly behaves like the first circuit section 1a (and/or the first RS flip-flop 2a formed by the 2-NAND gates 3a, 3b): the output of that 3-NAND gate 12c, 12db, to which that input signal (on signal, or bon signal) is fed, which is the first to change its state, accordingly changes its state in such a way, that the complementary output in each case is also prevented from changing its state in a corresponding way (i.e. an "evaluation"—correspondingly similar to that in the first circuit section 1a—takes place to determine which of the two signals (on signal, or bon signal) fed to the 3-NAND gates 12c, 12d is the first to change its state).

In accordance with the above embodiments, and as with conventional latch devices, the circuit device 1 may be used for the permanent and/or temporary storage of data fed—with the aid of the data-input signal (data signal)—to the circuit device 1, synchronously and/or in chronological relation to the clock pulse (clk signal) used in the semiconductor component—and to re-emit it again.

In this way the "set-up" and/or "hold" times (and/or times corresponding to these times)—that need to be maintained for the fault-free operation of the circuit device 1—are kept substantially shorter in the circuit device 1 shown in FIG. 1, than in conventional latch devices (e.g. shorter than 50 or 40, in particular shorter than 30 picoseconds), and are essentially dependent on the switching resolution time of the first RS flip flop 2a (that may e.g. amount to 10–20 picoseconds).

Apart from being able to be used as a latch device (and/or in addition to it), the circuit device 1 shown in FIG. 1 can e.g. also be used as a phase detector device, in particular to determine whether a first signal input at line 5—corresponding to the above data input signal (data signal)—in terms of phase—precedes or follows a second signal corresponding to the above clock pulse and input at line 7—(whereby line 5 then takes over the function of a first signal input line, and line 7 the function of a further signal input line).

| Reference numbers | |
|---|---|
| 1 | Circuit device |
| 1a | Circuit section |
| 1b | Circuit section |
| 1c | Circuit section |
| 2a | RS flip-flop |
| 2b | RS flip-flop |
| 3a | NAND gate |
| 3b | NAND gate |
| 4a | NAND gate |
| 4b | NAND gate |
| 5 | Data input line |
| 6 | Line |
| 7 | Clock pulse line |
| 8 | Line |
| 9 | Line |
| 10 | Line |
| 11 | Line |
| 12a | NAND gate |
| 12b | NAND gate |
| 12c | NAND gate |
| 12d | NAND gate |
| 13 | Line |
| 14 | Line |
| 15 | Line |
| 16 | Line |
| 17 | Line |
| 18 | Line |
| 19 | Line |
| 20 | Line |
| 21 | Line |
| 22 | Line |
| 23 | Line |
| 24 | Line |
| 25 | Line |
| 26 | Line |
| 27 | Line |
| 28 | Line |
| 29 | Line |
| 30 | Data output line |
| 31 | Data output line |

What is claimed is:

1. A circuit device, into which a first input signal and a second input signal are entered, comprising:

a first switching array to detect which of the two input signals is the first to change its state, comprising a first flip-flop which outputs first and second flip-flop output signals;

a second switching array, which emits an output signal, which, when the first input signal first changes its state, only changes its state in reaction to a change in the state of the second input signal, and, when the second input signal first changes its state, only changes its state in reaction to a change in the state of the first input signal, the second switching array comprising second and third flip-flops, and first and second NAND gates, the first NAND gate at a first input receiving the first flip-flop output signal, and the second NAND gate at a first input receiving the second flip-flop output signal, the second flip-flop outputting a third flip-flop output signal to a second input of the first NAND gate to control whether or not the first flip-flop output signal of the first flip-flop is to be relayed via the first NAND gate to the second flip-flop, and a fourth flip-flop output signal to a second input of the second NAND gate to control whether or not the second flip-flop output signal of the first flip-flop is to be relayed via the second NAND gate to the second flip-flop, the second flip-flop comprising third and fourth NAND gates with at least three inputs each.

2. The circuit device according to claim 1, in which the second input signal is a clock pulse.

3. The circuit device according to claim 1, wherein the first input signal is a data signal, which includes data to be latched by the circuit device.

4. The circuit device according to claim 1, wherein the first flip-flop is an RS flip-flop.

5. The circuit device according to claim 4, wherein the RS flip-flop has first and second NAND gates each having at least two inputs.

6. The circuit device according to claim 4, wherein the RS flip-flop has two NOR gates with at least two inputs each.

7. The circuit device according to claim 5, wherein the first input signal is fed to a first input of the first gate, and the second input signal to a first input of the second gate, and wherein the signal emitted at an output of the first gate is fed back to a second input of the second gate, and the signal emitted at an output of the second gate is fed back to a second input of the first gate.

8. A circuit device, into which a first input signal and a second input signal are entered, comprising:

a first switching array to detect which of the two input signals is the first to change its state, comprising a first flip-flop which outputs first and second flip-flop output signals;

a second switching array, which emits an output signal, which, when the first input signal first changes its state, only changes its state in reaction to a change in the state of the second input signal, and, when the second input signal first changes its state, only changes its state in reaction to a change in the state of the first input signal, the second switching array comprising second and third flip-flops, and first and second NOR gates, the first NOR gate at a first input receiving the first flip-flop output signal, and the second NOR gate at a first input receiving the second flip-flop output signal, the second flip-flop outputting a third flip-flop output signal to a second input of the first NOR gate to control whether or not the first flip-flop output signal of the first flip-flop is to be relayed via the first NOR gate to the second flip-flop, and a fourth flip-flop output signal to a second input of the second NOR gate to control whether or not the second flip-flop output signal of the first flip-flop is to be relayed via the second NOR gate to the second flip-flop, the second flip-flop comprising third and fourth NOR gates with at least three inputs each.

9. The circuit device according to claim 1, wherein the second signal is fed to an input of the first gate of the second switching array.

10. The circuit device according to claim 1, wherein the second signal is fed to an input of the second gate of the second switching array.

11. The circuit device according to claim 1, which is used as a latch device.

12. The circuit device according to claim 11, wherein the data is latched in the second switching array.

13. The circuit device according to claim 12, wherein, depending on whether the first signal, or the second signal is first to change its state, the data is accordingly latched either under control of a first switching element with at least three inputs, or under control of a second switching element with at least three inputs.

14. A circuit device according to claim 13, wherein depending on which of the first signal, or the second signal is first to change its state, either the first switching element, or the second switching element is correspondingly deactivated, and the respective other switching element is activated.

15. The circuit device according to claim 14, wherein the activation and or deactivation is controlled by a control signal provided by the first switching array.

16. The circuit device according to claim 1, wherein the circuit device is used as a phase detector device.

17. A circuit device, into which a first input signal and a second input signal are entered, comprising:
a first switching array to detect which of the two input signals is the first to change its state, comprising a first flip-flop which outputs first and second flip-flop output signals;
a second switching array, which emits an output signal, which, when the first input signal first changes its state, only changes its state in reaction to a change in the state of the second input signal, and, when the second input signal first changes its state, only changes its state in reaction to a change in the state of the first input signal, the second switching array comprising second and third flip-flops, and first and second NAND gates, the first NAND gate relaying the first flip-flop output signal of the first flip-flop to the second flip-flop in response to a third flip-flop output signal output by the second flip-flop, and the second NAND gate relaying the second flip-flop output signal of the first flip-flop to the second flip-flop in response to a fourth flip-flop output signal output by the second flip-flop, the second flip-flop comprising third and fourth NAND gates with at least three inputs each.

18. A circuit device, into which a first input signal and a second input signal are entered, comprising:
a first switching array to detect which of the two input signals is the first to change its state, comprising a first flip-flop which outputs first and second flip-flop output signals;
a second switching array, which emits an output signal, which, when the first input signal first changes its state, only changes its state in reaction to a change in the state of the second input signal, and, when the second input signal first changes its state, only changes its state in reaction to a change in the state of the first input signal, the second switching array comprising second and third flip-flops, and first and second NOR gates, the first NOR gate relaying the first flip-flop output signal of the first flip-flop to the second flip-flop in response to a third flip-flop output signal output by the second flip-flop, and the second NOR gate relaying the second flip-flop output signal of the first flip-flop to the second flip-flop in response to a fourth flip-flop output signal output by the second flip-flop, the second flip-flop comprising third and fourth NOR gates with at least three inputs each.

19. The circuit device according to claim 17, in which the second input signal is a clock pulse.

20. The circuit device according to claim 17, wherein the first input signal is a data signal, which includes data to be latched by the circuit device.

21. The circuit device according to claim 17, wherein the first flip-flop is an RS flip-flop.

22. The circuit device according to claim 21, wherein the RS flip-flop has first and second NAND gates each having at least two inputs.

23. The circuit device according to claim 21, wherein the RS flip-flop has two NOR gates with at least two inputs each.

24. The circuit device according to claim 22, wherein the first input signal is fed to a first input of the first gate, and the second input signal to a first input of the second gate, and wherein the signal emitted at an output of the first gate is fed back to a second input of the second gate, and the signal emitted at an output of the second gate is fed back to a second input of the first gate.

25. The circuit device according to claim 17, wherein the second signal is fed to an input of the first gate of the second switching array.

26. The circuit device according to claim 17, wherein the second signal is fed to an input of the second gate of the second switching array.

27. The circuit device according to claim 17, which is used as a latch device.

28. The circuit device according to claim 27, wherein the data is latched in the second switching array.

29. The circuit device according to claim 28, wherein, depending on whether the first signal, or the second signal is first to change its state, the data is accordingly latched either under control of a first switching element with at least three inputs, or under control of a second switching element with at least three inputs.

30. A circuit device according to claim 29, wherein depending on which of the first signal, or the second signal is first to change its state, either the first switching element, or the second switching element is correspondingly deactivated, and the respective other switching element is activated.

31. The circuit device according to claim 30, wherein the activation and/or deactivation is controlled by a control signal provided by the first switching array.

32. The circuit device according to claim 17, wherein the circuit device is used as a phase detector device.

* * * * *